(12) United States Patent
Wiedemuth et al.

(10) Patent No.: US 8,033,246 B2
(45) Date of Patent: *Oct. 11, 2011

(54) ARC SUPPRESSION

(75) Inventors: Peter Wiedemuth, Herbolzheim (DE);
Markus Bannwarth, Freiburg (DE);
Lothar Wolf, Sasbach (DE)

(73) Assignee: HUETTINGER Elektronik GmbH + Co. KG, Freiburg (DE)

( * ) Notice: Subject to any disclaimer, the term of this patent is extended or adjusted under 35 U.S.C. 154(b) by 969 days.

This patent is subject to a terminal disclaimer.

(21) Appl. No.: 11/381,842

(22) Filed: May 5, 2006

(65) Prior Publication Data

US 2008/0216745 A1 Sep. 11, 2008

Related U.S. Application Data

(66) Substitute for application No. 60/685,880, filed on Jun. 1, 2005.

(30) Foreign Application Priority Data

May 6, 2005 (EP) .................................... 05009875

(51) Int. Cl.
| | |
|---|---|
| C23C 16/00 | (2006.01) |
| C23F 1/00 | (2006.01) |
| H01L 21/306 | (2006.01) |
| H05B 31/26 | (2006.01) |
| C25B 11/00 | (2006.01) |
| C25B 13/00 | (2006.01) |

(52) U.S. Cl. ......... 118/723 E; 156/345.28; 156/345.43; 156/345.44; 315/111.21; 315/111.51; 315/111.71; 204/298.08

(58) Field of Classification Search ............... 118/723 E; 315/111.21–111.91; 156/345.28, 345.43, 156/345.44

See application file for complete search history.

(56) References Cited

U.S. PATENT DOCUMENTS

| | | | |
|---|---|---|---|
| 5,066,894 A | 11/1991 | Klier | |
| 5,192,894 A | 3/1993 | Teschner | |
| 5,281,321 A | 1/1994 | Sturmer et al. | |
| 5,303,139 A | 4/1994 | Mark | |
| 5,576,939 A * | 11/1996 | Drummond | ..................... 363/16 |
| 5,584,972 A | 12/1996 | Lantsman | |
| 5,584,974 A * | 12/1996 | Sellers | ..................... 204/192.13 |

(Continued)

FOREIGN PATENT DOCUMENTS

DE 4 127 505 2/1993

(Continued)

OTHER PUBLICATIONS

English translation of Office Action from corresponding Japanese Application No. 2006-129601, mailed Jun. 22, 2009, 10 pages.

(Continued)

*Primary Examiner* — Parviz Hassanzadeh
*Assistant Examiner* — Rakesh Dhingra
(74) *Attorney, Agent, or Firm* — Fish & Richardson P.C.

(57) ABSTRACT

An arc suppression arrangement suppresses arcs in a gas discharge device that is operated with an alternating voltage from a power supply. The arc suppression arrangement includes an arc suppression device and an arc identification device that controls the arc suppression device. The arc suppression device includes at least one controllable resistor that is connected in series in an electrical line that extends from an alternating voltage source to an electrode of the gas discharge device. An arc can thereby be prevented from being provided with energy.

24 Claims, 2 Drawing Sheets

U.S. PATENT DOCUMENTS

| | | | |
|---|---|---|---|
| 5,611,899 A | | 3/1997 | Maass |
| 5,698,082 A | | 12/1997 | Teschner et al. |
| 5,807,470 A | | 9/1998 | Szczyrbowski et al. |
| 5,815,388 A | * | 9/1998 | Manley et al. .................. 363/63 |
| 5,882,492 A | * | 3/1999 | Manley et al. ........... 204/298.08 |
| 5,910,886 A | | 6/1999 | Coleman |
| 6,011,704 A | | 1/2000 | Coleman |
| 6,096,174 A | | 8/2000 | Teschner et al. |
| 6,621,674 B1 | | 9/2003 | Zahringer et al. |
| 6,735,099 B2 | | 5/2004 | Mark |
| 7,305,311 B2 | * | 12/2007 | van Zyl ........................... 702/57 |
| 7,531,070 B2 | * | 5/2009 | Kuriyama et al. ....... 204/298.08 |
| 7,586,210 B2 | | 9/2009 | Wiedemuth et al. |
| 2003/0174526 A1 | | 9/2003 | Mark |
| 2006/0032738 A1 | | 2/2006 | Wiedemuth et al. |
| 2007/0241287 A1 | | 10/2007 | Eyhorn et al. |

FOREIGN PATENT DOCUMENTS

| | | | |
|---|---|---|---|
| DE | 19834719 A1 | | 2/2000 |
| DE | 10306347 A1 | | 8/2004 |
| EP | 1 441 576 | | 7/2004 |
| JP | 55145170 A | | 11/1980 |
| JP | 58045379 | | 3/1983 |
| JP | 06-119997 | | 4/1994 |
| JP | 2003268541 | | 9/2003 |
| WO | 9730468 A1 | | 8/1997 |
| WO | WO 03/030345 | * | 10/2003 |
| WO | WO 2004/072754 | * | 8/2004 |
| WO | WO 2005/020273 | | 3/2005 |

OTHER PUBLICATIONS

Office Action from corresponding Japanese Application No. 2006-129601, mailed Feb. 20, 2009, 5 pages.

Anderson et al., "Process Control Requirements for Uniform Large Area Coatings", Society of Vacuum Coaters, 45th Annual Technical Conference Proceedings, 2002, pp. 148-152.

Rettich et al., "High Power Generators for Medium Frequency Sputtering Applications", Society of Vacuum Coaters, 40th Annual Technical Conference Proceedings, 1997, pp. 135-138.

Rettich et al., "Arc Management in DC and MF Generators for Large Area Coating Systems", Society of Vacuum Coaters, 47th Annual Technical Conference Proceedings, 2004, pp. 237-240.

Office Action from corresponding Taiwanese Application No. 095116099, issued Jan. 21, 2010, with English Translation, 10 pages.

Office Action from corresponding European Application No. 05009875.5, dated Aug. 13, 2010, with English translation, 6 pages.

* cited by examiner

ARC SUPPRESSION

CROSS REFERENCE TO RELATED APPLICATIONS

This application claims priority under 35 U.S.C. §119 to EP 05 009 875.5, filed on May 6, 2005, and to U.S. Application No. 60/685,880, filed Jun. 1, 2005. Both of these applications are hereby incorporated by reference in their entirety.

TECHNICAL FIELD

The invention relates to suppression or extinguishing of arcs in a gas discharge device that is operated with an alternating voltage.

BACKGROUND

Vacuum plasma generators can be an integral component of an alternating voltage gas discharge excitation arrangement that couples to a gas discharge device for treating a workpiece. Vacuum plasma generators can have different power classifications and different output signal forms.

In vacuum glass coating, for example, medium frequency (MF) vacuum plasma generators are used that have an MF output signal with power levels of between 30 and 300 kW. The MF output signal is mostly a sinusoidal signal having frequencies of between 10 kHz and 200 kHz. The output voltages may be from several 100 V to above 1000 V. In order to ignite plasma in the gas discharge device, the output voltages of vacuum plasma generators are often much higher than during normal operation.

In the plasma, brief and also longer-lasting spark-overs, so-called arcs, may occur, and such arcs are undesirable. An arc is generally identified by a break-up or a drop in the voltage at the vacuum plasma generator and an increase in the current at the vacuum plasma generator, for example, at the output of the vacuum plasma generator or at another location in the vacuum plasma generator. If an arc of this type is identified, it is extinguished or prevented from reaching a maximum level.

For example, in DE 41 27 505 C2, the output of the alternating current generator is caused to short circuit when an arc is identified, which is a suitable method for low-power MF generators. The higher the power levels become, the higher the voltages and currents also become and a switch for short circuiting would have to be able to short circuit such higher currents. Components of such a switch are usually larger and more expensive to fabricate. In some cases, components of a short circuiting switch would be connected in series and/or in parallel in order to be able to switch off the high voltages and currents. When arcs occur, the MF generator should supply as little residual energy as possible into the gas discharge device. For example, in MF generators for Flat Panel Display (FPD) production, an arc may lead to pixel errors, and a single pixel error can have a significant influence on the quality of a large surface-area (for example, for 19" thin film transistor monitors) and consequently can cause a comparatively high level of damage.

In some designs, when an arc is identified, control to the vacuum plasma generator or to parts of the vacuum plasma generator is switched off so that no further energy flows into an output oscillating circuit of the generator. This procedure may not be sufficient for FPD production since there can still be too much residual energy in the output oscillating circuit of the generator, in the inductors of an output transformer that may be provided in the generator, and in the supply lines to the generator.

SUMMARY

An arc suppression arrangement is designed so that arcs in a gas discharge process coupled to the arrangement can be effectively extinguished or suppressed.

The arc suppression device includes at least one controllable resistor that is connected in series in an electrical line that extends from an alternating voltage source to an electrode of the gas discharge device. The electrical line can be any type of electrically-conductive connection between an alternating voltage generator and a gas discharge device in an alternating voltage generator or in a gas discharge device. An arc identification device that controls the arc suppression device can be provided.

The controllable resistor can be controlled in such a manner that it has a low resistance value during normal operation and has a high resistance value when an arc is identified. At a high resistance value, residual energy that is stored in an output oscillating circuit coupled to the arc suppression arrangement, in inductors of an output transformer of the output oscillating circuit, and in inductors of the supply line to a gas discharge device coupled to the output oscillating circuit can be consumed, that is, converted into heat and thereby kept away from the gas discharge device. Such an arc suppression arrangement effectively protects the workpiece in the gas discharge device from arcs, since it consumes the residual energy.

The controllable resistor can have a lower resistance value during arc-free operation than during an occurrence of an arc. Thus, only a small amount of power is consumed by the controllable resistor during normal operation and, when arcs occur, a high level of power is consumed that is thereby kept away from the gas discharge device. The arc is thereby no longer supplied with energy and can consequently be extinguished or not reach a maximum level in the first place.

In one implementation, the controllable resistor has a resistance value of < about 1Ω, in particular ≦ about 0.1Ω, during arc-free operation, and a resistance value of > about 100 kΩ, in particular ≧ about 1 MΩ, when an arc is identified and during the occurrence of the arc. The controllable resistor is therefore controlled in such a manner that it changes from a low impedance resistance value to a high impedance resistance value when an arc is identified. During the transition period, part of the energy from the output oscillating circuit of the generator is consumed. The remainder remains in the generator.

The transition from a low to a high resistance value does not necessarily have to be carried out in a uniform or linear manner by means of a control signal, but can instead also change in a non-linear manner, for example, first slowly and then very rapidly, to a high resistance value. If, for example, the impedance when an arc occurs is approximately 2Ω, the controllable resistor, which has a resistance value of less than 0.1Ω during normal operation, can first be controlled for a few μs at a value that is also in the region of about 2Ω, for example, about 1-5Ω. The energy is then divided between the arc and the controllable resistor and a very large proportion of the energy is consumed in the switch and kept away from the gas discharge.

It can be advantageous to change the controllable resistor as quickly as possible from values of <0.1 about Ω to values of > about 1 MΩ and to suppress the current flow in this manner. However, inductors, for example, of the output oscillating circuit and of the supply lines ensure that a flow of current is maintained. A current that flows through an inductor cannot be suddenly interrupted. Attempting to install an interruption switch in a current loop having inductors could lead to excessive voltage rises at the opening switch, and thus would ultimately always lead to a spark-over at the interrupting switch. In principle, the current in the output oscillating circuit can remain therein and fade at that location; it does not itself necessarily lead to a voltage increase across the controllable resistor. However, the supply line inductors have no possibility of dissipating the flowing current and a controllable resistor has some advantages over an openable switch.

The controllable resistor is also not necessarily linear over the voltage or the current. It can, for example, have a constant voltage drop independently of the current in the low impedance state.

In one implementation, the at least one controllable resistor includes a transistor, in particular an Insulated Gate Bipolar Transistor (IGBT), having a diode that is connected in parallel with the transistor. Using a transistor, in particular an IGBT, a controllable resistor can be produced in a particularly simple manner.

The controllable resistor can have two oppositely connected transistors, in particular IGBTs, that are connected in series and that each have a diode that is connected in parallel with the transistor. During normal operation, that is to say, during arc-free operation, both transistors are closed and therefore conductive. If an arc is identified, both transistors are opened. Since the transistors are connected oppositely, the controllable resistor can be controlled in a conductive manner and switched for both half waves of the alternating voltage, that is to say, for two opposite current flow directions. IGBTs have the advantage that they withstand high blockage voltages and can switch high currents. The switching losses of IGBTs are particularly advantageous in the present application since the energy consumed cannot reach the gas discharge process.

For the operating method described above, it is advantageous for the diode that is in each case connected in parallel to a transistor to be arranged in an (antiparallel) conducting direction opposite to that of the transistor. Each IGBT conducts the current in one direction respectively in the closed low impedance state. In the direction of the IGBT that also blocks in the switched-on state, the diode takes over the current flow. The current flows in one direction across the first transistor and the antiparallel diode of the second transistor, and accordingly in the other direction across the second transistor and the antiparallel diode of the first transistor.

The arc suppression arrangement can have at least one voltage limitation circuit, in particular for limiting the voltage that is applied across the controllable resistor or a transistor that is contained therein. By this means, the controllable resistor or the semi-conductor components, such as transistors, that are contained therein can be prevented from being overloaded in terms of voltage. When an arc is identified, the resistance value of the controllable resistor is abruptly increased, for example, by switches, in particular transistors that are contained therein, being opened. The current, induced by the inductors of the supply lines to the gas discharge chamber of the gas discharge device and/or the output transformer of the alternating voltage generator, brings about a high voltage across the controllable resistor. The voltage limitation acts on the controllable resistor or the switches that are contained therein, by making the switches of the controllable resistor at least partially conductive again, that is to say, the resistance value of the controllable resistor is reduced again, the value preferably remaining high-impedance.

A voltage is thereby applied across the controlled resistor and a current flows. Heat is thereby produced and power is thereby consumed. The power that is converted into heat does not reach the gas discharge chamber of the gas discharge device. Significantly reduced energy is therefore supplied to the arc and the arc is thereby suppressed or extinguished. The remaining energy oscillates in the oscillating circuit of the alternating voltage generator. The controllable resistor or the integral components thereof can be cooled, in particular, by means of water cooling.

The arc suppression arrangement is particularly effective if a voltage limitation circuit is associated with each transistor. Since the transistors that are connected oppositely are connected in series, they are with their connections at different potentials respectively. In order to effectively protect each transistor from excessive voltages, it is therefore advantageous for each transistor to have its own voltage limitation circuit.

In one implementation, the voltage limitation circuit includes at least one diode, preferably a plurality of diodes that are connected in series. The diodes of the voltage limitation circuit can be constructed as fast Z-diodes, Z-diodes of this type being referred to as Transil diodes (Transil is a registered trademark of the company SGS-Thomson).

In one implementation, at least one controllable connection arrangement is arranged between two lines that extend to different electrodes. Owing to the connection arrangement, a short-circuit can be produced between the lines so that any remaining residual energy can be eliminated. The residual energy is consequently consumed in a supplementary circuit and not in the gas discharge process. A controllable connection arrangement is preferably provided in each case at both sides of the arc suppression device. The connection arrangement can be controlled by the arc identification device.

The controllable connection arrangement can include at least one transistor. A transistor is controllable and a short circuit can be produced thereby. The connection arrangement can include additional elements, such as, for example, resistors, in which heat can be produced so that as much residual energy as possible can be consumed in the connection arrangement.

In another implementation, an alternating voltage gas discharge excitation arrangement includes an alternating voltage generator, in particular a medium frequency generator, and an arc suppression arrangement. The arc suppression arrangement can be arranged completely or partially in the alternating voltage generator. For example, the arc identification device can be arranged in the alternating voltage generator and the arc suppression device can be arranged outside the alternating voltage generator. In particular, the arc suppression device can be arranged in one of the supply lines from the generator to the gas discharge device. The arc suppression device can be arranged in the vicinity of the connection of the gas discharge device. All the elements can be arranged in the alternating voltage generator, in particular in a medium frequency generator, so that the alternating voltage generator substantially corresponds to the alternating voltage gas discharge excitation arrangement.

In one implementation, the alternating voltage generator includes a voltage converter and a voltage converter control system that is connected to the arc identification device. It is thereby possible, in addition to controlling the arc suppression device when an arc is identified, to also inform the voltage converter control system of the occurrence of an arc so that it can control the voltage converter in such a manner that as little energy as possible is supplied to the output oscillating circuit of the alternating voltage generator. By this means, keeping energy or power away from the gas discharge process when an arc occurs can be carried out even more effectively.

If the voltage converter is connected to an output oscillating circuit, an alternating voltage can be tapped from the generator in a particularly simple manner.

In another implementation, a method is described for suppressing arcs in a gas discharge device that is operated with an alternating voltage from a power supply. The method includes determining whether an arc has been produced in a gas discharge device by determining whether an electrical value exceeds a predetermined value, if the electrical value remains below a predetermined value, maintaining a resistance at a resistance device between the power supply and the gas discharge device, and if the electrical value exceeds or equals the predetermined value, raising the resistance at the resistance device such that power is consumed.

Implementations can include one or more of the following features. For example, determining whether the electrical value exceeds the predetermined value can include determining whether one or more of a current, a voltage, or an output of an alternating current generator between the power supply and the gas discharge device exceeds the predetermined value. Raising the resistance at the resistance device can include raising the resistance such that power generated in the alternating current generator is consumed and not supplied to the gas discharge device. Raising the resistance at the resistance device can include opening a transistor in the resistance device.

In another general aspect, a system includes an alternating voltage source, an electrode coupled to the alternating voltage source by an electrical line including a resistor and coupled to a gas discharge device, and a resistor controller configured to increase the resistance of the resistor in response to an occurrence of an arc on the electrical line.

Implementations can include one or more of the following features. For example, the alternating voltage source can operate at a medium frequency. The system can include an arc identification device that controls the resistor controller. The resistor can have a resistance value of less than about 1Ω during arc-free operation, and a resistance value of greater than about 100 kΩ during occurrence of an arc. The resistor can include a transistor having a diode connected in parallel with the transistor. The transistor can include an insulated gate bipolar transistor.

The system can include at least one voltage limitation circuit. The voltage limitation circuit can be associated with each transistor.

Unless otherwise defined, all technical and scientific terms used herein have the same meaning as commonly understood by one of ordinary skill in the art to which this invention belongs. Although methods and materials similar or equivalent to those described herein can be used in the practice or testing of the present invention, suitable methods and materials are described below. All publications, patent applications, patents, and other references mentioned herein are incorporated by reference in their entirety. In case of conflict, the present specification, including definitions, will control. In addition, the materials, methods, and examples are illustrative only and not intended to be limiting.

Other features and advantages of the invention will be apparent from the following detailed description, and from the claims.

DESCRIPTION OF DRAWINGS

Like reference symbols in the various drawings may indicate like elements.

DETAILED DESCRIPTION

Figure 1A:
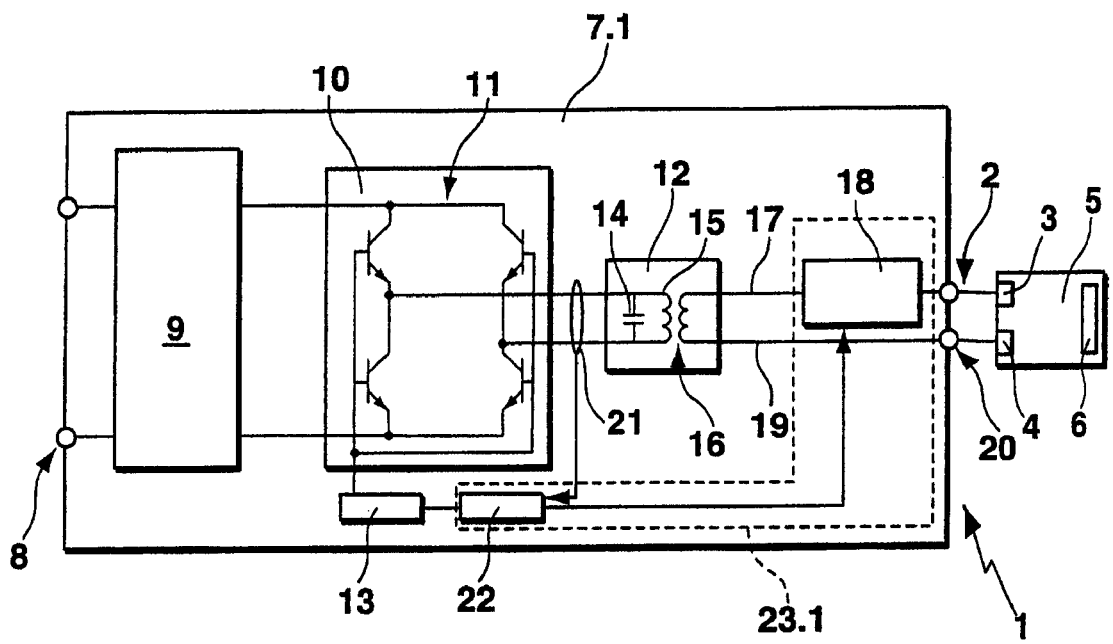
FIG. 1a shows a schematic diagram of a first configuration of an alternating voltage gas discharge excitation arrangement that is connected to a gas discharge chamber.

FIG. 1a illustrates an alternating voltage gas discharge excitation arrangement 1 that is connected at an output connection 20, by means of supply lines 2, to electrodes 3, 4 of a gas discharge device 5 that produces a plasma. The electrodes 3, 4 are arranged in a vacuum chamber in which a workpiece 6 is processed.

The alternating voltage gas discharge excitation arrangement 1 includes an alternating voltage generator 7.1 that has a power supply connection 8. A power supply rectifier 9 is connected to the power supply connection 8 and may have additional structural components, such as, for example, a DC/DC converter. A voltage converter 10 is arranged downstream of the power supply rectifier 9 and has a bridge circuit 11. An output oscillating circuit 12 is controlled by the voltage converter 10. The output signal of the voltage converter 10 is adjusted by means of a voltage converter control system 13, which controls the voltage converter 10 by adjusting currents fed into transistors of the voltage converter 10. The voltage converter 10 and the output oscillating circuit 12 can be considered as an alternating voltage source.

The output oscillating circuit 12 includes a capacitor 14 and a leakage inductor 15 of an output transformer 16. The output transformer 16 acts as a galvanic isolation device. Furthermore, the output transformer 16 can be used to adjust the voltage from the voltage converter 10. An arc suppression device 18 is connected in series in the electrical line 17 that extends to the electrode 3 of the gas discharge device 5. During normal operation, an MF alternating voltage is applied between the electrical lines 17, 19 and at the output connection 20 of the alternating voltage generator 7.1.

An arc produced in the gas discharge chamber of the gas discharge device 5 affects one or more of the current, the voltage, and the output in the alternating current generator 7.1. One or more of these values can be measured, for example, by a measuring device 21 that is arranged between the voltage converter 10 and the output oscillating circuit 12. However, the measuring device 21 could also be arranged at another location in the alternating voltage generator 7.1 or even at the gas discharge device 5.

Based on the value(s) measured by the measuring device 21, an arc identification device 22 can determine whether an arc has occurred or is being produced. The arc identification device 22, in the same manner as the arc suppression device 18, is part of an arc suppression arrangement 23.1. The arc identification device 22 is further connected to the voltage converter control system 13. The arc suppression device 18 has at least one controllable resistor that, during normal operation, assumes a lower resistance value and, when an arc is identified, is controlled in such a manner that it assumes a high resistance value so that power generated in the alternating voltage generator 7.1 is consumed in the arc suppression device 18 and is not supplied to the gas discharge device 5.

Figure 1B:
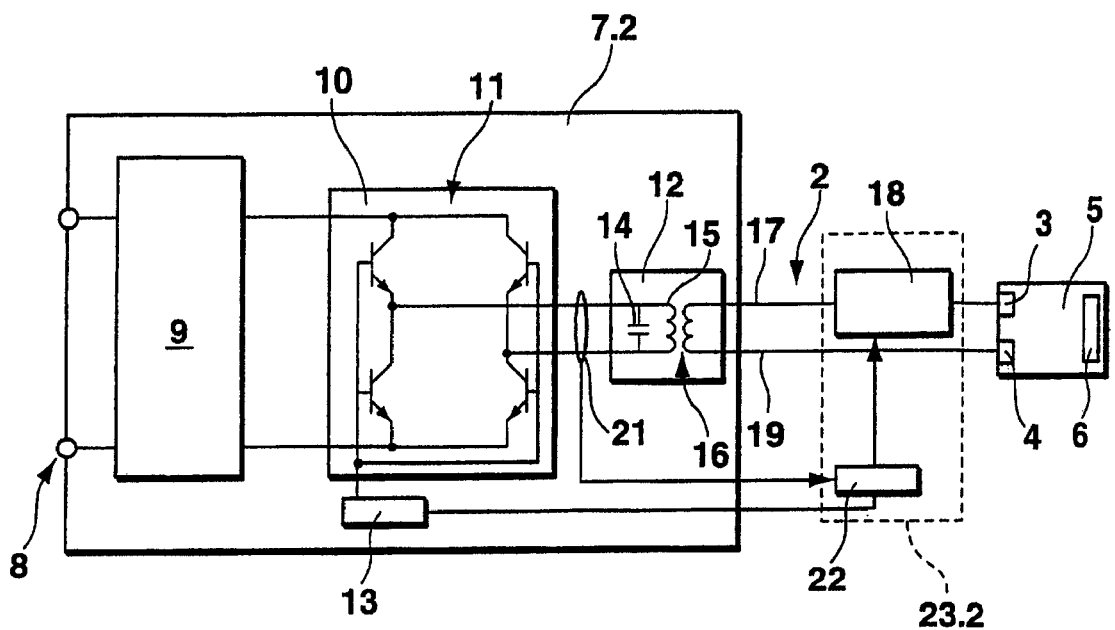
FIG. 1b shows a schematic diagram of a second configuration of the alternating voltage gas discharge excitation arrangement.

FIG. 1b substantially corresponds to FIG. 1a, with the difference that the arc suppression arrangement 23.2 is arranged outside the alternating voltage generator 7.2. The arc suppression device 18 is arranged in one of the supply lines 2 to the gas discharge device 5.

Figure 2:
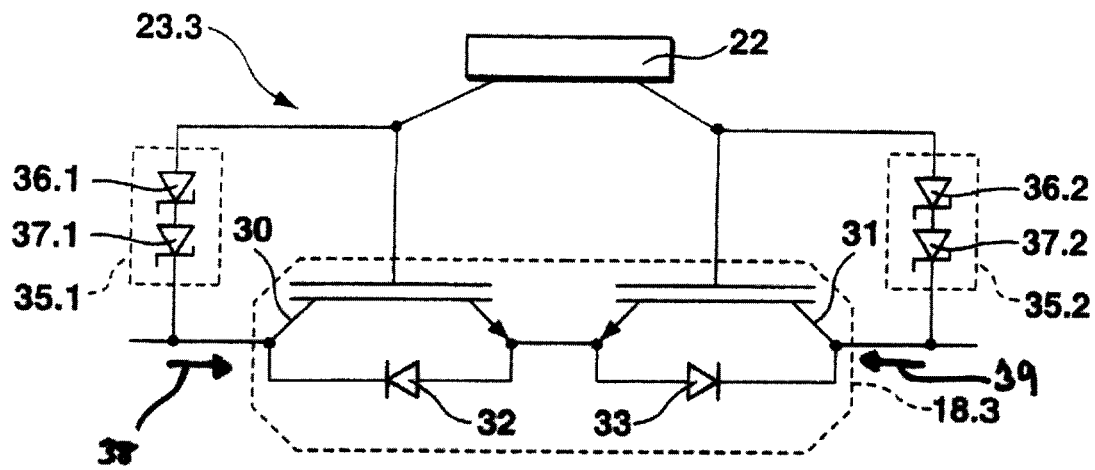
FIG. 2 shows a schematic diagram of a first implementation of an arc suppression arrangement.

FIG. 2 illustrates a configuration of an arc suppression arrangement 23.3. The arc suppression arrangement 23.3 includes an arc suppression device 18.3 having two oppositely connected transistors 30, 31 that are connected in series, that are constructed as insulated gate bipolar transistors (IGBTs), and that constitute a controllable resistor. A diode 32, 33 is connected in parallel to the transistors 30, 31, respectively. The diodes 32, 33 are arranged with a conducting direction opposite to that of the respective transistor 30, 31. The transistors 30, 31 are controlled by the arc identification device 22, which detects an occurrence of a fault.

FIG. 2 also illustrates, for each transistor, a voltage limitation circuit 35.1 and 35.2 that includes, respectively, two Z diodes 36.1, 37.1; 36.2, 37.2. During normal operation, the transistors 30, 31 are connected in a conductive manner such that a current flow is produced across the transistor 30 and the diode 33 in the direction of arrow 38 and a current flow is produced across the transistor 31 and the diode 32 in the direction of arrow 39.

In another implementation, the transistors 30, 31 can be replaced by a single component that can be connected in a conductive manner in both directions 38, 39 and can nonetheless be operated as a controllable resistor.

If an arc occurs, the arc identification system 22 detects the arc, and controls the transistors 30, 31 in such a manner that they open. Thus, current flow in the direction of arrow 38 or in the direction of arrow 39 is prevented, and the resistance of the arc suppression arrangement 23.3 rises substantially.

The voltage limitation circuit 35.1, 35.2 acts to limit the voltage that is applied across the controllable resistor or the transistor of the arc suppression device 18.3 to prevent voltage overload at the controllable resistor or the transistor. When an arc is identified, the resistance value of the controllable resistor is abruptly increased, for example, by the transistors 30, 31 being opened, as discussed above. However, the current, induced by the inductors of the supply lines to the gas discharge chamber of the gas discharge device and/or the output transformer of the alternating voltage generator, causes a high voltage across the arc suppression arrangement 23.3.

If the potential at line 17 becomes too large, the voltage limitation circuit 35.1 causes the transistor 30 to be at least partially conductive again, and thus the resistance value of the controllable resistor is reduced by a small amount. Because of the voltage drop across the transistor 30, and a small current flowing through the transistor 30 and diode 33, power is consumed in the transistor 30 and a small amount of current and power enters the gas discharge chamber. However, this small amount of current is not enough to maintain an arc, and the transistor 30 is protected because voltage across the transistor 30 is limited. Moreover, because there is a small amount of current flowing through the transistor 30, the overall resistance of the arc suppression device 183 is reduced when compared to the situation in which the transistor 30 is fully opened but is higher than the situation in which the transistor 30 is fully closed and conducting. Additionally, if the potential at the power supply line 2 becomes too large, then the voltage limitation circuit 35.2 causes the transistor 31 to be at least partially conductive again, thus enabling a small current to flow through the transistor 31 and the diode 32 and power to be consumed in the transistor 31. Thus, when the voltage limitation circuit 35.1, 35.2 determines a voltage to the transistors 30, 31 exceeds a predetermined value, the transistors 30, 31 are again switched to a conducting state so that, in addition to the high voltage that is applied across the transistors 30, 31 when an arc is identified, a current flows and power is consumed.

Figure 3:
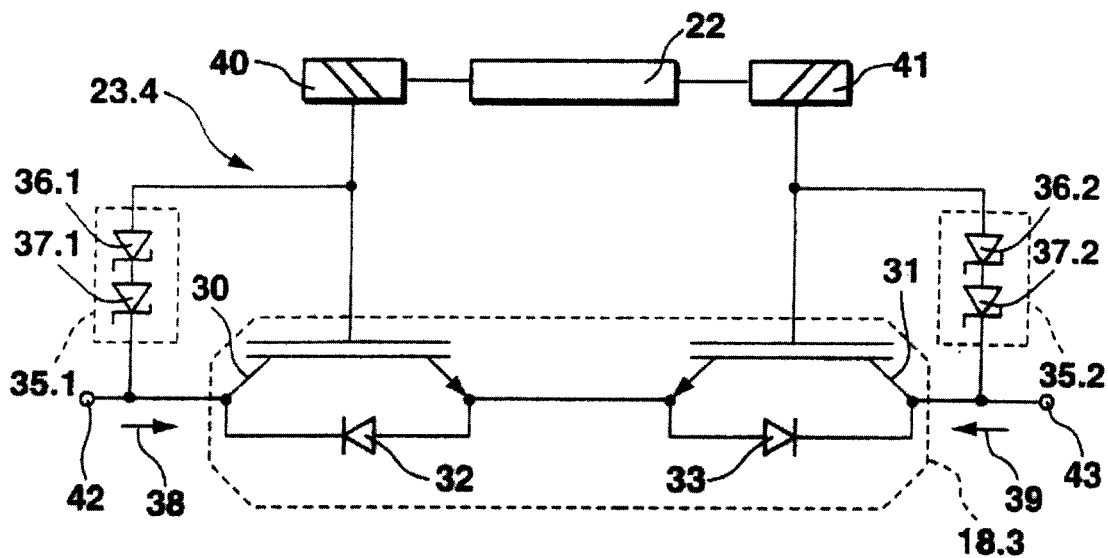
FIG. 3 shows a schematic diagram of a second implementation of an arc suppression arrangement.

In the arc suppression arrangement 23.4 of FIG. 3, a galvanic isolation arrangement 40, 41 is connected between the arc identification device 22 and the transistors 30, 31, respectively. Such a design is useful because the transistors 30, 31 are each connected to a different potential with the connections 42, 43 thereof when an arc is identified.

Figure 4:
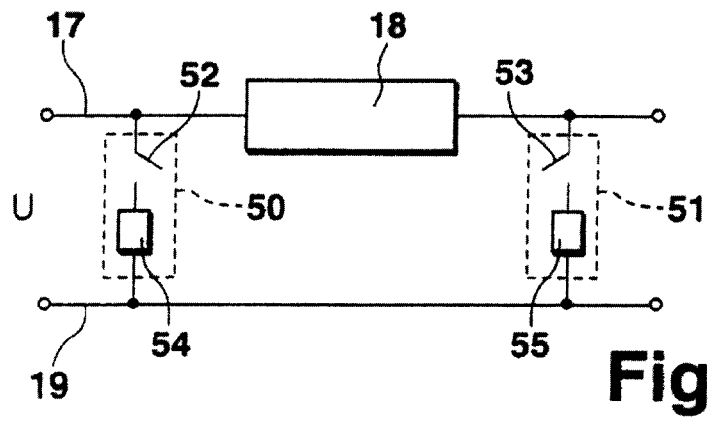
FIG. 4 shows a schematic diagram of a third implementation of an arc suppression arrangement.

In the illustration of FIG. 4, optional controllable connection arrangements 50, 51 are additionally arranged at both sides of the arc suppression device 18, by means of which the lines 17, 19, to which an alternating voltage U is applied at the generator side, can be connected, in particular be caused to short-circuit. To this end, the connection arrangements 50, 51 have switching elements 52, 53 that are constructed as transistors. A resistor 54, 55 is connected in series to the switching elements 52, 53, respectively, so that power is consumed in the resistors 54, 55 when a current flows through the connection arrangement 50, 51. Residual energy stored in the oscillating circuit 12, in the output transformer 16 or in the inductors of the lines 17, 19 can thereby be converted or consumed.

OTHER IMPLEMENTATIONS

A number of implementations have been described. Nevertheless, it will be understood that various modifications can be made. Accordingly, other implementations are within the scope of the following claims.

What is claimed is:

1. An arc suppression arrangement for suppressing arcs in a gas discharge device operated with an alternating voltage generated by an alternating voltage source, the arc suppression arrangement comprising:
   an arc suppression device including at least one controllable resistor connected in series with the alternating voltage source and an electrode of the gas discharge device, the at least one controllable resistor including a transistor having a diode connected in parallel with the transistor, the electrode configured to receive the alternating voltage; and
   a voltage limitation circuit associated with each transistor;
   wherein the controllable resistor has a lower resistance value during arc-free operation than during occurrence of an arc.

2. The arc suppression arrangement of claim 1, wherein the alternating voltage source operates at a medium frequency.

3. The arc suppression arrangement of claim 1, further comprising an arc identification device that controls the arc suppression device.

4. The arc suppression arrangement of claim 1, wherein the controllable resistor has a resistance value of < about 1Ω during arc-free operation, and a resistance value of > about 100 kΩ, during occurrence of an arc.

5. The arc suppression arrangement of claim 4, wherein the controllable resistor has a resistance value of ≦ about 0.1Ω during arc-free operation, and a resistance value of ≧ about 1 MΩ during occurrence of an arc.

6. The arc suppression arrangement of claim 1, wherein the transistor includes an insulated gate bipolar transistor.

7. The arc suppression arrangement of claim 1, wherein the arc suppression device includes two oppositely connected transistors that are connected in series and that each have a diode that is connected in parallel with the respective transistor.

8. The arc suppression arrangement of claim 7, wherein a voltage limitation circuit is associated with each of the oppositely connected transistors.

9. The arc suppression arrangement of claim 7, wherein each diode is arranged with a conducting direction opposite to that of its respective transistor.

10. The arc suppression arrangement of claim 1, wherein the voltage limitation circuit includes at least one diode.

11. The arc suppression arrangement of claim 10, wherein the voltage limitation circuit includes a plurality of diodes that are connected in series.

12. The arc suppression arrangement of claim 11, wherein the diodes of the voltage limitation circuit are constructed as Z diodes.

13. The arc suppression arrangement of claim 1, further comprising at least one controllable connection arrangement arranged between two lines that extend to different electrodes.

14. The arc suppression arrangement of claim 1, further comprising a controllable connection arrangement provided at both sides of the arc suppression device.

15. The arc suppression arrangement of claim 14, wherein the controllable connection arrangement includes at least one transistor.

16. An alternating voltage gas discharge excitation arrangement comprising:
   an alternating voltage generator; and
   an arc suppression arrangement for extinguishing arcs in a gas discharge device operated with an alternating voltage generated by an alternating voltage source, the arc suppression arrangement comprising:
   an arc suppression device including at least one controllable resistor connected in series with the alternating voltage source and an electrode of the gas discharge device, the electrode configured to receive the alternating voltage, the at least one controllable resistor including a transistor having a diode connected in parallel with the transistor, and
   an arc identification device;
   wherein the alternating voltage generator includes a voltage converter comprising a bridge circuit, and a voltage converter control system connected to the arc identification device.

17. The alternating voltage gas discharge excitation arrangement of claim 16, wherein the voltage converter is connected to an output oscillating circuit.

18. The alternating voltage gas discharge excitation arrangement of claim 17, wherein the voltage converter control system controls the voltage converter when an arc is identified by the arc identification device in such a manner that the voltage converter provides no energy to the output oscillating circuit.

19. A system comprising: an alternating voltage source;
   a controllable resistive element including a transistor having a diode connected in parallel with the transistor;
   an electrode coupled to the alternating voltage source in series with the resistive element and coupled to a gas discharge device, the electrode configured to receive an alternating voltage generated by the alternating voltage source; and
   a controller configured to increase the resistance of the resistive element in response to an occurrence of an arc in the gas discharge device.

20. The system of claim 19, wherein the alternating voltage source operates at a medium frequency.

21. The system of claim 19, further comprising an arc identification device that controls the controller.

22. The system of claim 19, wherein the resistive element has a resistance value of less than about 1Ω during arc-free operation, and a resistance value of greater than about 100 kΩ during occurrence of an arc.

23. The system of claim 19, wherein the transistor includes an insulated gate bipolar transistor.

24. The system of claim 19, further comprising at least one voltage limitation circuit associated with the transistor.

* * * * *